United States Patent [19]

Campbell et al.

[11] Patent Number: 4,910,576
[45] Date of Patent: Mar. 20, 1990

[54] MEMORY CELL

[75] Inventors: Richard N. Campbell, Cwbran; Jonathan Edwards, Yatton; Michael K. Thompson, Newport, all of United Kingdom

[73] Assignee: Inmos Limited, Bristol, England

[21] Appl. No.: 142,835

[22] Filed: Jan. 6, 1988

[30] Foreign Application Priority Data

Jan. 8, 1987 [GB] United Kingdom ............... 8700347

[51] Int. Cl.$^4$ ............ H01L 29/04; H01L 27/02; H01L 23/48
[52] U.S. Cl. ............................ 357/59; 357/41; 357/71
[58] Field of Search ............... 357/59 F, 59 I, 41

[56] References Cited

U.S. PATENT DOCUMENTS

| | | | |
|---|---|---|---|
| 4,110,776 | 8/1978 | Rao et al. | 357/51 |
| 4,125,854 | 11/1978 | McKenny et al. | 357/41 |
| 4,208,781 | 6/1980 | Rao et al. | 437/41 |
| 4,214,917 | 7/1980 | Clark et al. | 357/45 |
| 4,234,889 | 11/1980 | Raymond, Jr. et al. | 357/71 |
| 4,240,097 | 12/1980 | Raymond, Jr. | 357/71 |
| 4,246,592 | 1/1981 | Bartlett | 357/41 |
| 4,246,593 | 1/1981 | Bartlett | 357/41 |
| 4,247,915 | 1/1981 | Bartlett | 365/154 |
| 4,322,824 | 3/1982 | Allan | 365/185 |
| 4,471,374 | 9/1984 | Hardee et al. | 357/59 |
| 4,486,944 | 12/1984 | Hardee | 437/52 |

FOREIGN PATENT DOCUMENTS 254653 12/1985 Japan ................... 357/41

Primary Examiner—Rolf Hille
Assistant Examiner—Robert P. Limanek
Attorney, Agent, or Firm—Edward D. Manzo

[57] ABSTRACT

In a semi-conductor memory cell components are formed in regions separated from each other by one or more insulation layers (40) and first and second load resistors (20,22) and gate regions (70,72) of first and second cross-coupled driver field effect transistors (16,18) are formed in a first conductive layer (64) and the word line (36) and gate regions (66,68) of first and second transfer transistors (28,30) are formed in a second conductive layer (60).

16 Claims, 4 Drawing Sheets

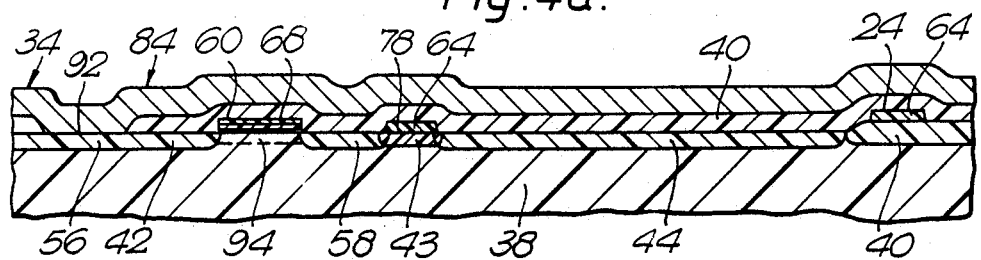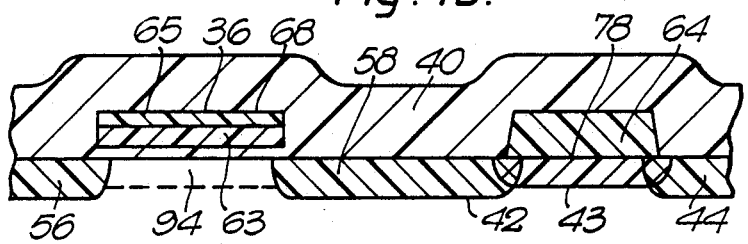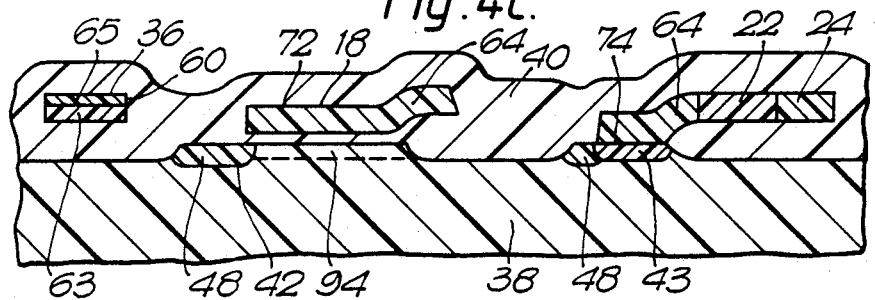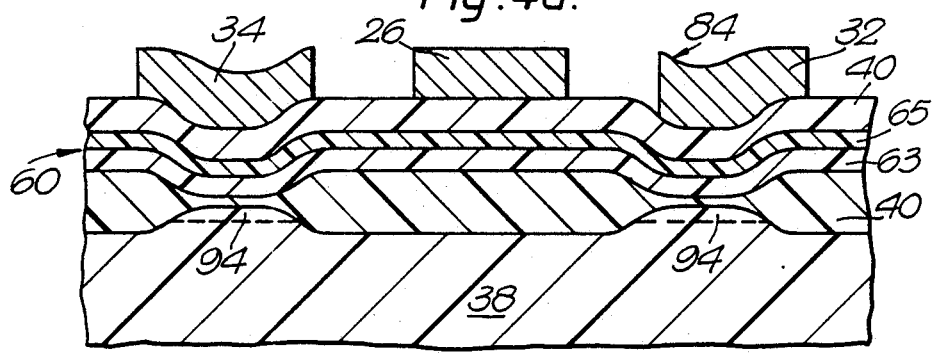

MEMORY CELL

The invention relates to static RAM cells and to methods of making such cells.

BACKGROUND OF THE INVENTION

RAM cells fabricated with MOS technology are known in which a cell includes a standard flip-flop arranged from a pair of cross-coupled driver transistors, a pair of load resistors, a power supply line, a ground line, a pair of transfer transistors coupled to the flip-flop and arranged in conjunction with a pair of data lines and a word line for accessing data in the flip-flop. Such a cell is shown in U.S. Pat. Nos. 4,471,374 and 4,486,944 by Kim Hardee.

It is known to provide memory cells in which the word line, the gates of the driver transistors, the gates of the transfer transistors which form the word line, the load resistors and the supply line are all defined and fabricated in the same polysilicon layer. This is the case in the above mentioned U.S. patent specifications. In this particular example the ground line is a buried (n+) diffusion layer.

It is further known to provide a static RAM cell in which the gates of the driver transistors, the gates of the transfer transistors which form the word line and the supply line are all formed in the same polysilicon layer. In such a cell the load resistors have been formed in a second level of polysilicon lying above the first level, and insulated from the first level by a non-conducting film. Connections between the two levels of polysilicon are provided in this case by removing the non-conducting film in the required areas.

A disadvantage of this cell is the inability of the metal film (which forms the data lines) to cover adequately the additional vertical steps introduced by the second level of polysilicon. A second disadvantage is the processing complications introduced by the requirement to interconnect the two polysilicon layers.

A disadvantage of all the above known cells is the use of polysilicon word lines. Typically the resistance of the polysilicon layer will be greater than 20 ohms per square. This means that there is a long propagation delay down the word line, which is a very significant fraction of the access (or cycle) time of the memory device. In order to reduce the memory access time (and therefore produce higher speed RAMs) it is necessary to significantly reduce the propagation delay down the length of the word line.

A cell has been proposed in which a second level of metal forms a low resistance word conductor which runs on top of and in parallel with the polysilicon word line. The second metal word conductor is interconnected with the polysilicon word line at intervals along the length of the word line. This reduces the propagation delay down the word line to a small fraction of what it would be without the word conductor. However, a disadvantage of this implementation is the very significant additional processing complexity of a double metal technology.

Another way to reduce the resistance of the word line in to use a silicide or polysilicon/silicide ("polycide") low resistivity gate material in place of the relatively high resistivity polysilicon layer.

It is known to provide 4 transistor 2 resistor static RAM cells in which the gates of the two driver transistors, the gates of the two transfer transistors (and therefore word line) and the ground line are all formed in the same polycide layer. The two load resistors and the supply line are formed in a second level of polysilicon in a similar manner to the implementation having 2 overlying polysilicon layers. The disadvantages are the metal film's inability to adequately cover the vertical steps in the polysilicon layer, and the processing complications as described earlier.

SUMMARY OF THE PRESENT INVENTION

The present invention provides a memory cell structure on a substrate of semiconductor material having first and second cross-coupled driver field effect transistors and first and second load resistors arranged in conjunction with a power supply line and a ground line to form a flip-flop, and having first and second transfer transistors arranged in conjunction with a word line and first and second data lines for accessing data with the flip-flop, the components of the memory cell structure being formed in regions separated from each other by one or more insulation layers, in which the first and second load resistors and the gate regions of the first and second cross-coupled driver field effect transistors are formed in a first conductive layer and the word line and gate regions of the first and second transfer transistors are formed in a second conductive layer.

Preferably said second conductive layer has a lower resistivity than said first conductive layer. Preferably the first conductive layer is polycrystalline silicon and the second conductive layer is a low resistivity silicide or polycide.

Preferably no electrical interconnections are provided within the cell between the two conductive layers.

Preferably said first and second conductive layers do not overlie each other.

Preferably said memory cell comprises a static RAM cell.

Preferably said cell is fabricated with MOS technology.

Said memory cell may be formed on a substrate including CMOS circuitry.

Said memory cell may include N-channel transistors.

Alternatively said memory cell may comprise P-channel transistors.

Preferably said first conductive layer provides a direct electrical interconnection between said first and second load resistors and the gate regions of the first and second driver transistors.

Preferably the word line and gate regions of the first and second transfer transistors are formed integrally by the second conductive layer which is of lower resistivity than the first conductive layer.

Preferably the first and second conductive layers are arranged to provide components in the respective layers which do not need electrical interconnection within the cell.

The thickness of the insulation layer under the gate region of said driver transistors may be different from the thickness of the insulation layer under the gate region of said transfer transistors.

The threshold voltage of the said driver transistors may be different from the threshold voltage of said transfer transistors.

The invention also provides a method for fabricating a memory cell as aforesaid comprising forming first and second load resistors and gate regions of first and second cross-coupled driver field effect transistors in a first conductive layer and forming a word line and gate regions of first and second transfer transistors in a second conductive layer of lower resistivity than said first conductive layer.

BRIEF DESCRIPTION OF THE DRAWINGS

FIG. 4a is a section on the line 4A—4A in FIG. 3, FIG. 4b is an enlarged view of part of FIG. 4a, FIG. 4c is a section on the line 4C—4C in FIG. 3, and FIG. 4d is a section on the line 4D—4D in FIG. 3,

DETAILED DESCRIPTION OF AN EMBODIMENT OF THE INVENTION

Figure 1:
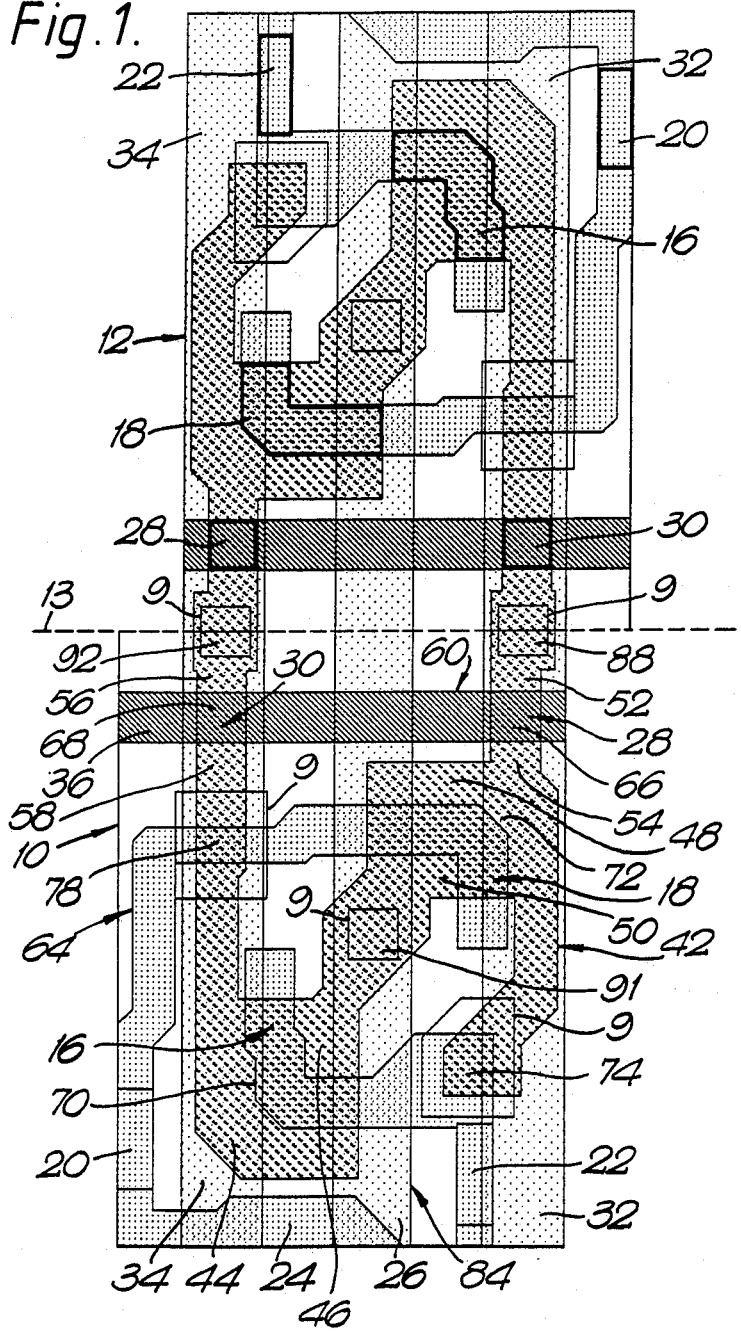
FIG. 1 is a plan view of a pair of shared memory cells from a static RAM memory array on a semiconductor chip.
Figure 3:
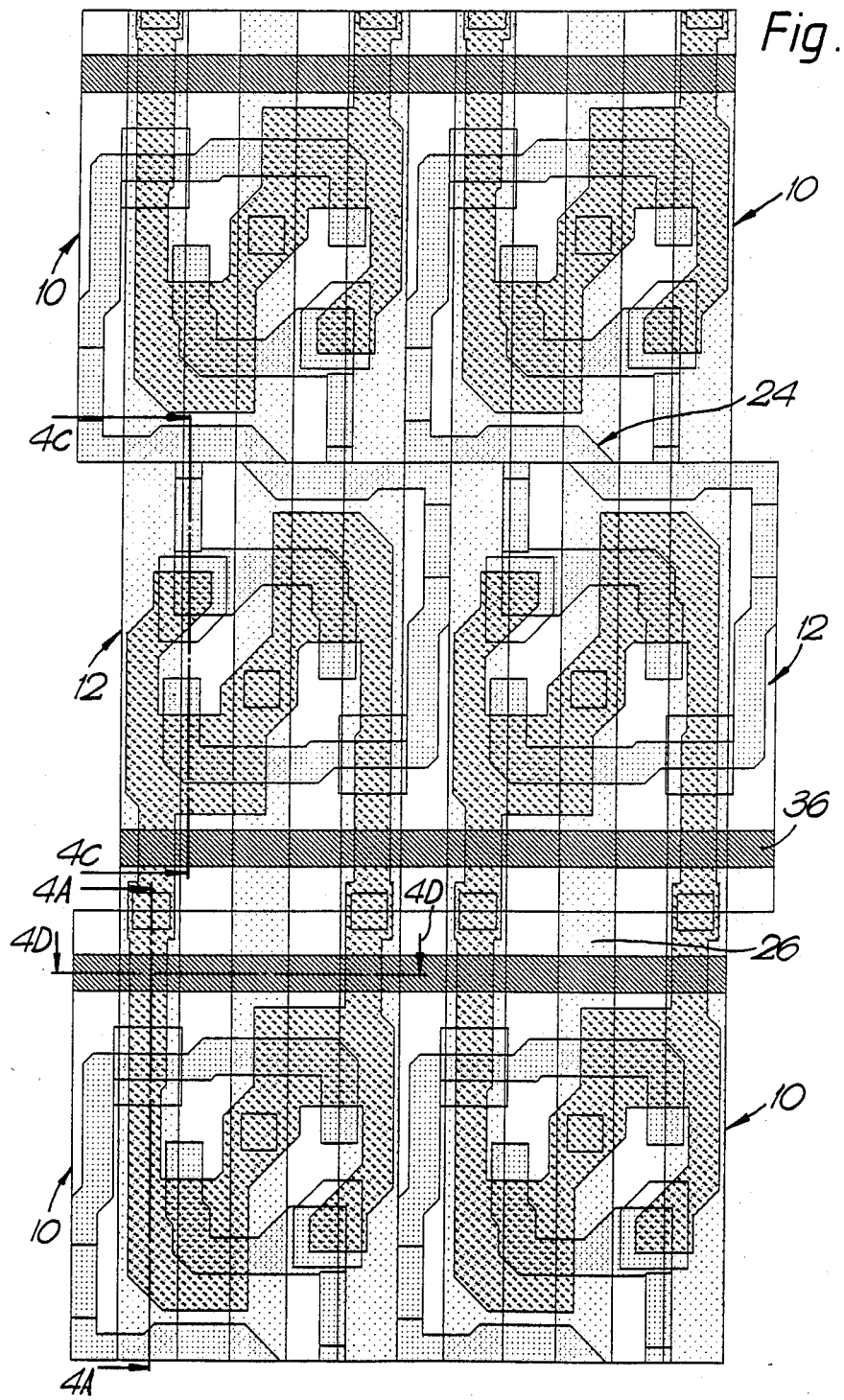
FIG. 3 is a view similar to FIG. 1 illustrating an array of six cells.

Referring to FIG. 1, a pair of static RAM cells 10 and 12 forming part of a static memory array depict a preferred embodiment of the invention. For purposes of illustration, the cells 10 and 12 are separated by a dotted line 13 in FIG. 1. Also, only the conductive regions and contacts of the two cells are shown. Contact oxide cuts are labelled 9 in FIG. 1. Each memory cell in the static memory array shares common elements or components with adjacent memory cells. The manner in which components are shared will be discussed in more detail later in the description, and can be seen in FIG. 3 which illustrates an array of six cells.

Figure 2:
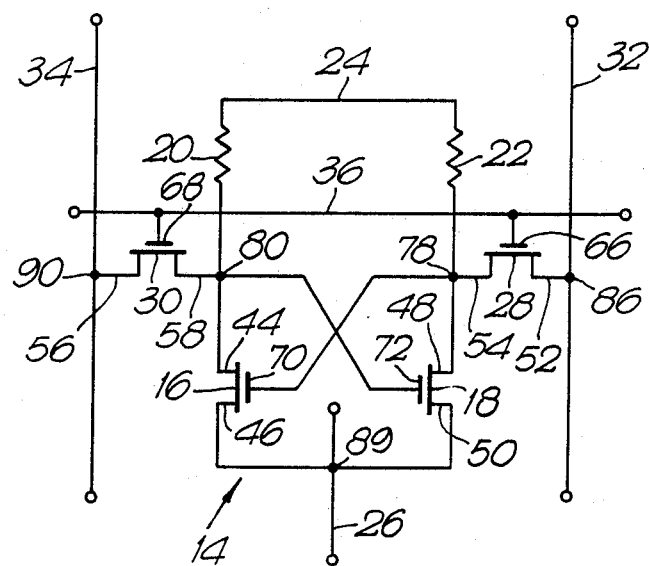
FIG. 2 is an electrical schematic diagram of one of the cells of FIG. 1.

FIG. 2 illustrates the electrical circuitry of cell 10. The cell includes a standard flip-flop 14 arranged from a pair of cross-coupled driver transistors 16 and 18, a pair of load resistors 20 and 22, a power supply or Vcc line 24, and a ground or Vss line 26. A pair of transfer transistors 28 and 30 are coupled to the flip-flop 14 and arranged in conjunction with a pair of data lines 32 and 34 and a word line 36 for accessing data in the flip-flop 14. As shown in the cross-sectional diagrams FIGS. 4a-4d the components of cell 10 are fabricated on or on top of a substrate 38 of semiconductor material and are isolated from each other, except for electrical connections, by an insulation region 40, which is preferably silicon dioxide.

Referring to FIGS. 1 and 4a-4d an N+ region 42 in the P-substrate 38 creates a conductivity region for forming the drain regions 44, 48, 52 and 56 and the source regions 46, 50, 54 and 58 of the transistors 16, 18, 28 and 30 respectively. The drain and source regions are doped with arsenic. The source regions 46 and 50 of the driver transistors 16 and 18 overlap.

A polycrystalline silicon ("polysilicon") region 64 is formed within insulation region 40 and above the N+ region 42 to provide a second conductivity region which forms the gate regions 70 and 72 of driver transistors 16 and 18, respectively, as well as load resistors 20 and 22 and the Vcc line 24. The gate regions 70 and 72 are respectively connected to one end of load resistors 22 and 20. The other ends of load resistors 20 and 22 are adjacent and perpendicular to the Vcc line 24. The load resistors 20 and 22 maintain high resistivity characteristics as they are formed from a lighter doped polysilicon area in the region 64.

A third conductivity region 60 is formed within insulation region 40 and above N+ region 42. Preferably the material of this third conductivity region is a low resistivity polycide consisting of a phosphorous or arsenic doped polysilicon layer 63 with a low resistivity silicide layer 65 on top. The word line 36 and the gate regions 66 and 68 of transfer transistors 28 and 30, respectively, are formed in a common portion of the third conductivity region.

The source region 54 of transfer transistor 28, which overlaps and is common with the drain region 48 of driver transistor 18, is connected to the gate region 70 of driver transistor 16 at contact area 74, thereby forming electrical connection 78. Similarly, the source region 58 of transfer transistor 30, which is electrically common (via doping 43 in contact area 78) with the drain region 44 of driver transistor 16, is connected to the gate region 72 of driver transistor 18 at contact area 78, thereby forming electrical connection 80.

An aluminium region 84 having dopants therein such as silicon titanium and/or copper is formed on the top surface of the insulation region 40 above the N+ diffusion region 42, the polysilicon region 64, and the low resistivity polycide region 60, to delineate the data lines 32 and 34 and the ground or Vss line 26. Each data line forms a connection with a corresponding drain region of a transfer transistor. One connection 86 is created at contact area 88 where data line 32 penetrates the insulation region 40 to the drain region 52 of transfer transistor 28 of cell 10. The connection 90 is created at contact area 92 where data line 34 penetrates the insulation region 40 to the drain region 56 of transfer transistor 30 of cell 10. The contact areas 88 and 92 or, alternatively the connections 86 and 90 are commonly shared by the adjacent memory cell 12. The connection 89 is created at contact area 91 where the ground or Vss line 26 penetrates the insulation region 40 to the overlapping source regions 46 and 50 of the driver transistors 16 and 18 respectively.

A process for making a preferred embodiment of the static RAM cell 10, as described above, will now be discussed. A slice of P- type monocrystalline semiconductor silicon material is used as the substrate 38. The single cell structure which is fabricated on the wafer represents only a very small portion of the wafer area. Initially, the wafer is covered with a silicon dioxide layer (not shown). This is followed by covering the wafer with a silicon nitride layer (not shown). Then certain areas of the silicon nitride layer are etched off. Boron is now implanted into the regions of the substrate not blocked by the remaining silicon nitride (not shown).

Thereafter, a layer of insulation material (silicon dioxide) is conventionally grown on the regions of the substrate not blocked by the silicon nitride. Subsequently, the remaining portions of silicon nitride and underlying silicon dioxide are etched off. Now, the formation of the memory cell begins. First, a layer of insulation material (silicon dioxide) is conventionally grown over the entire wafer. Next, enhancement implanting occurs through the most recently grown insulation material and into the substrate 38 below the future gate regions and between the future drain regions and the future source regions of the soon to be enhancement mode transistors 16, 18, 28 and 30. Thin layers at these specific regions in the substrate are thereby P+ type doped to ensure better on and off characteristics for the enhancement mode transistors. This enhancement layer is labelled 94 in FIGS. 4a-4d.

Subsequently, portions of the insulation material are etched off in order to expose contact areas 74 and 78 on future drain regions 48 and 44 respectively. Next an N type dopant 43 is implanted into contact areas 74 and 78.

In the following step, a first layer of polycrystalline silicon 64 is deposited onto the surface of the wafer. As a result, the contact areas 74 and 78 are covered. Thereafter, this polysilicon layer is lightly doped N type. Subsequently, a mask is utilized in etching off portions of the polysilicon layer to form gate regions 70 and 72 of the driver transistors 16 and 18 respectively, interconnects, and load resistor regions (20,22). The layer of insulation material most recently grown on the surface of the wafer is now removed from the areas not covered by the remaining polysilicon regions.

In the next step of the process, a further layer of insulation material (silicon dioxide) is conventionally grown over the entire wafer. Next if it is desired to adjust independently the on and off characteristics of the transfer and driver transistors, a further implanting (which may be of N-type or P-type dopant) can occur through the last grown insulation layer and into the substrate 38 below the future gate regions and between the future drain regions and the future source regions of the soon to be enhancement mode transfer transistors 28 and 30. Subsequently, a second layer of polycrystalline silicon 63 is deposited over the entire wafer, which is thereafter doped N+ by phosphorous or arsenic. A layer of tungsten silicide 65 is then deposited over the entire wafer which, in combination with the previously deposited and doped polysilicon layer 63, and after appropriate annealing, forms the low resistivity polycide layer 60. Subsequently, a mask is utilized in etching off portions of the polycide layer to form the word line 36 which incorporates the gate regions 66 and 68 of the transfer transistors 28 and 30, respectively.

Next, the drain regions and the source regions of the driver transistors 16 and 18 and transfer transistors 28 and 30 are implanted into the areas of the substrate not covered by the remaining portions of the polysilicon layer or the remaining portions of the polycide layer or the first grown insulation layer. The remaining polysilicon layer 64 is concurrently N type doped except for the load resistor regions 20 and 22 which are blocked from the N type doping by means of a masking operation.

The process is continued by depositing a layer of insulation material which is preferably silicon dioxide which may be doped with phosphorous and/or boron. It should be noted at this point, that the total of deposited and grown insulation layers combine to form an insulation region 40 which encloses the polycide and polysilicon layers therein, except for the polysilicon regions at contact areas 74 and 78. In the next step, portions of the insulation material are etched off down to contact areas 88 and 92 on the drain regions 52 and 56 of the transfer transistors 28 and 30, and down to contact area 91 on the overlapping source regions 46 and 50 of driver transistors 16 and 18. Thereafter, a metal layer of aluminum is deposited over the entire wafer so as to be connected to the drain regions 52 and 56 of the transfer transistors 28 and 30, and to the overlapping source regions 46 and 50 of driver transistors 16 and 18. In a final step, aluminum is etched off portions of the metal layer to delineate a pair of data lines 32 and 34 connected to contact areas 88 and 92, and a ground or Vss line 26 connected to contact area 91. This completes the fabrication of the memory cell. However, a passivation oxide (not shown) may be deposited over the wafer as a protection barrier.

In the above description, specific details of an embodiment of the invention have been provided for a thorough understanding of the inventive concepts. It will be understood by those skilled in the art that many of these details may be varied without departing from the spirit and scope of the invention.

For example, the slice of P- type monocrystalline semiconductor material referred to above could be a P-type doped region ("P-well") implanted and/or diffused into the surface of an N- type substrate of monocrystalline semiconductor material. Such an embodiment might be used where the static RAM is fabricated on the same substrate as CMOS circuitry, the CMOS circuitry consisting of N-channel field effect transistors formed in the P-well regions of the substrate and P-channel transistors formed in the remaining regions of the substrate.

Also, although an N-channel embodiment of the invented static RAM cell is described, it should be understood that a P-channel implementation could be used. For a P-channel implementation the polarity type of the described substrate materials, dopants and conductivity layers would be reversed where necessary.

ADVANTAGES OF THE ABOVE DESCRIBED EMBODIMENTS OF THE INVENTION (1) A short word line propagation delay is achieved without the complications of a double metal technology.

(2) The load resistors are formed in a different polysilicon layer to the word line. It is practically difficult to fabricate load resistors in a polycide layer; selective removal or selective deposition of silicide would be required.

(3) In the above examples no interconnections are required between the polysilicon and polycide layers. Previously known double polysilicon cells require contact regions between the two polysilicon (or polysilicon and polycide) layers.

(4) Although the above implementation uses two polysilicon layers, the defined features in these layers never overlap and are always spaced at least a defined minimum distance from one another. The use of two polysilicon layers in this manner does not introduce additional vertical steps over which the metal layer which forms the data lines must have adequate step coverage. In the known double polysilicon cells referred to above, the second level of polysilcon overlaps regions of the first polysilicon or polycide layer, thereby introducing additional vertical steps over which the metal layer must have adequate step coverage.

(5) Enhancement mode threshold control implanted impurity in the substrate and the thickness of the insulation layer under the gate region of the transfer transistors can be different from enhancement mode threshold control implanted impurity in the substrate and the thickness of the insulation layer under the gate region of the driver transistors.

This allows the gains and threshold voltages of the driver and transfer transistors to be independently adjustable so that the electrical characteristics of the RAM cell can be optimised.

It will be appreciated that in the above examples the two conductive layers are arranged to provide components on the respective layers which do not need to be electrically interconnected between the layers within the cells so that the two conductive layers do not need to overlap each other or make contact with each other within the cell. The first conductive layer providing the first and second load resistors and the gate regions of the first and second driver transistors provides a direct interconnection between these elements. Similarly the second conductive layer provides the word line and the gate regions of the transfer transistors as a single integral conducting unit. Polycrystalline silicon which is doped with arsenic which may be used for the gates of the driver transistors may have a relatively low resistance of the order of 100 ohms per square. The region used for the load resistors may have a high resistance of the order of 100 megohms per resistor. The polycide may comprise polycrystalline silicon which has been doped with arsenic or phosphorous to provide a resistance of the order of 20 ohms per square and by use of a silicide layer such as tungsten silicide the polycide resistance may be reduced to the order of 2 or 3 ohms per square. Instead of using the polycide for the lower resistivity layer a silicide layer or a high temperature melting point refractory metal layer may be provided directly on the gate oxide to form the lower resistivity layer.

The invention is not limited to the details given above.

We claim:

1. A memory cell structure on a substrate of semiconductor material having first and second cross-coupled driver field effect transistors and first and second load resistors arranged in conjunction with a power supply line and a ground line to form a flip-flop, and having first and second transfer transistors arranged in conjunction with a word line and first and second data lines for accessing data with the flip-flop, the components of the memory cell structure being formed in regions separated from each other by one or more insulation layers, in which the first and second load resistors and the gate regions of the first and second cross-coupled driver field effect transistors are formed in a first conductive layer and the word line and gate regions of the first and second transfer transistors are formed in a second conductive layer, said first conductive layer being formed prior to the formation of said second conductive layer, said first conductive layer being formed of polycrystalline silicon and said second conductive layer being formed of low resistivity silicide.

2. A memory cell structure on a substrate of semiconductor material having first and second cross-coupled driver field effect transistors and first and second load resistors arranged in conjunction with a power supply line and a ground line to form a flip-flop, and having first and second transfer transistors arranged in conjunction with a word line and first and second data lines for accessing data with the flip-flop, the components of the memory cell structure being formed in regions separated from each other by one or more insulation layers, in which the first and second load resistors and the gate regions of the first and second cross-coupled driver field effect transistors are formed in a first conductive layer and the word line and gate regions of the first and second transfer transistors are formed in a second conductive layer, said first conductive layer being formed prior to the formation of said second conductive layer, said first conductive layer being formed of polycrystalline silicon and said second conductive layer being formed of low resistivity polycide.

3. A memory cell structure on a substrate of semiconductor material having first and second cross-coupled driver field effect transistors and first and second load resistors arranged in conjunction with a power supply line and a ground line to form a flip-flop, and having first and second transfer transistors arranged in conjunction with a word line and first and second data lines for accessing data with the flip-flop, the components of the memory cell structure being formed in regions separated from each other by one or more insulation layers, in which the first and second load resistors and the gate regions of the first and second cross-coupled driver field effect transistors are formed in a first conductive layer, said first conductive layer being formed prior to the formation of said second conductive layer, said first conductive layer being formed of polycrystalline silicon and said second conductive layer being formed of a high temperature melting point refractory metal.

4. A memory cell according to claim 1 wherein the second conductive layer has a lower resistivity than said first conductive layer.

5. A memory cell according to claim 1 wherein no electrical interconnections are provided within the cell between the two conductive layers.

6. A memory cell according to claim 1 wherein said first and second conductive layers do not overlie each other.

7. A memory cell according to claim 1 wherein said memory cell comprises a static RAM cell.

8. A memory cell according to claim 1 wherein said cell is fabricated with MOS technology.

9. A memory cell according to claim 1 wherein said memory cell is formed on a substrate including CMOS circuitry.

10. A memory cell according to claim 1 wherein said memory cell includes N-channel transistors.

11. A memory cell according to claim 1 wherein said memory cell comprises P-channel transistors.

12. A memory cell according to claim 1 wherein said first conductive layer provides a direct electrical interconnection between said first and second load resistors and the gate regions of the first and second driver transistors.

13. A memory cell according to claim 1 wherein the word line and gate regions of the first and second transfer transistors are formed integrally by the second conductive layer which is of lower resistivity than the first conductive layer.

14. A memory cell according to claim 1 wherein the thickness of the insulation layer under the gate region of said driver transistors is different from the thickness of the insulation layer under the gate region of said transfer transistors.

15. A memory cell according to claim 1 wherein said driver transistors have a threshold voltage different from the threshold voltage of said transfer transistors.

16. A memory cell according to any of claims 1, 2 or 3 wherein the first conductive layer provides components which need no electrical interconnection with components provided by the second conductive layer.

* * * * *

UNITED STATES PATENT AND TRADEMARK OFFICE
CERTIFICATE OF CORRECTION

PATENT NO. : 4,910,576

DATED : Mar. 20, 1990

INVENTOR(S) : CAMPBELL ET AL.

It is certified that error appears in the above—identified patent and that said Letters Patent is hereby corrected as shown below:

Column 8, <u>Claim 3</u>, line 16, insert --and the word line and gate regions of the first and second transfer transistors are formed in a second conductive layer-- before the ",".

Signed and Sealed this

Fourth Day of August, 1992

Attest:

DOUGLAS B. COMER

Attesting Officer      Acting Commissioner of Patents and Trademarks